(12) United States Patent
Momose

(10) Patent No.: US 11,147,155 B2
(45) Date of Patent: Oct. 12, 2021

(54) ELECTRONIC APPARATUS EQUIPPED WITH FLEXIBLE BOARDS

(71) Applicant: CANON KABUSHIKI KAISHA, Tokyo (JP)

(72) Inventor: Hideaki Momose, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/850,523

(22) Filed: Apr. 16, 2020

(65) Prior Publication Data

US 2020/0344871 A1 Oct. 29, 2020

(30) Foreign Application Priority Data

Apr. 25, 2019 (JP) .............................. JP2019-084359

(51) Int. Cl.
*H05K 1/02* (2006.01)
*H04N 5/225* (2006.01)
*H05K 1/14* (2006.01)

(52) U.S. Cl.
CPC ........... *H05K 1/025* (2013.01); *H04N 5/2251* (2013.01); *H05K 1/028* (2013.01); *H05K 1/0219* (2013.01); *H05K 1/0245* (2013.01); *H05K 1/147* (2013.01); *H05K 2201/0792* (2013.01); *H05K 2201/09227* (2013.01); *H05K 2201/09672* (2013.01); *H05K 2201/09681* (2013.01)

(58) Field of Classification Search
CPC .... H05K 1/025; H05K 1/0219; H05K 1/0245; H05K 1/028; H05K 1/147; H05K 2201/0792; H05K 2201/09227; H05K 2201/09672; H05K 2201/09681
See application file for complete search history.

(56) References Cited

U.S. PATENT DOCUMENTS

| 6,043,669 A * | 3/2000 | Carroll ................. G01R 1/0735 324/750.26 |
| 6,220,093 B1 * | 4/2001 | Hirosawa ........... G01C 19/5607 73/504.16 |
| 2010/0103223 A1 * | 4/2010 | Yamada ................. H05K 1/118 347/50 |

(Continued)

FOREIGN PATENT DOCUMENTS

JP 2000077802 A 3/2000

*Primary Examiner* — Hoa C Nguyen
(74) *Attorney, Agent, or Firm* — Rossi, Kimms & McDowell LLP

(57) ABSTRACT

An electronic apparatus which achieves ease of incorporating flexible boards into the electronic apparatus and ease of impedance control at the same time. A first flexible board and a second flexible board are placed along a structure having a bent portion and a flat portion. Differential signal wires are wired on one surface of the first flexible board placed between the structure and the second flexible board, and first ground wires for impedance control of the differential signal wires are wired on the other surface and on a rear side of the differential signal wires. Second ground wires for impedance control of the differential signal wires are wired on one surface of the second flexible board the one surface of the first flexible board faces. A wiring density of the first and second ground wires differs between an area along the bent portion and an area along the flat portion.

10 Claims, 6 Drawing Sheets

(56) References Cited

U.S. PATENT DOCUMENTS

| | | | |
|---|---|---|---|
| 2012/0028481 A1* | 2/2012 | Saito | H04N 5/2251 |
| | | | 439/55 |
| 2013/0021522 A1* | 1/2013 | Yamada | H05K 1/028 |
| | | | 348/372 |
| 2014/0085856 A1* | 3/2014 | Shirao | H01P 5/028 |
| | | | 361/803 |
| 2018/0180828 A1* | 6/2018 | Zhao | G02B 6/4279 |
| 2018/0235087 A1* | 8/2018 | Uchida | H05K 3/3463 |
| 2019/0014665 A1* | 1/2019 | Yazaki | H01F 27/29 |
| 2019/0182949 A1* | 6/2019 | Misawa | G02B 6/4271 |
| 2019/0387614 A1* | 12/2019 | Wang | H05K 1/0251 |

* cited by examiner

ELECTRONIC APPARATUS EQUIPPED WITH FLEXIBLE BOARDS

BACKGROUND OF THE INVENTION

Field of the Invention

The present invention relates to an electronic apparatus.

Description of the Related Art

With recent improvements in functions of electronic apparatuses, high-speed transmission of digital data is required. To achieve high-speed transmission of digital data, transmission techniques such as LVDS (Low Voltage Differential Signaling) and USB (Universal Serial Bus) are used. LVDS is a high-speed (several hundred Mbps) transmission technique for which circuits and protocols can be relatively freely designed, and it is widely used to transmit signals for an image pickup unit and a liquid crystal display device in digital cameras, cellular phones, and so forth. According to LVDS, signals of small voltage amplitude are transmitted by the differential method, and a characteristic impedance of a pair of differential transmission paths is designed to be a predetermined value determined based on the LVDS standards. Designing to make the characteristic impedance coincide with the predetermined value (hereafter referred to as "impedance control") is implemented by adjusting the wiring width and wiring interval of the differential transmission paths. Impedance control is performed by providing ground wires in proximity to wires on the differential transmission paths, and adjusting the wiring width of the ground wires (see, for example, Japanese Laid-Open Patent Publication (Kokai) No. 2000-77802). For example, the ground wires are provided on a rear side of a substrate on one surface of which wiring on the differential transmission paths is provided, or on a surface of one substrate placed in proximity to and in opposed relation to the other substrate on which wires on the differential transmission paths are provided. By providing around wires in a predetermined wiring pattern in proximity to the wires on the differential transmission paths, parasitic components such as parasitic resistance and parasitic capacitance on the differential transmission paths, which are required for impedance control, can easily be estimated, making it possible to accurately make the characteristic impedance coincide with the predetermined value.

In an electronic apparatus, there may be a case where the wires on the differential transmission paths are provided on a flexible board that is thin and flexible, and the flexible board is assembled along a component that is partially bent.

However, if the ground wires for implementing impedance control are provided on one surface of the flexible board, a thickness of the flexible board will increase, causing the flexible board to lose its flexibility. As a result, incorporating the flexible board in a bent state into a main body of the electronic apparatus will become difficult. To maintain the flexibility of the flexible board, it is conceivable that no ground wires for implementing impedance control are provided on the flexible board, and impedance control is performed merely by adjusting the wiring width and wiring interval of the differential transmission paths. If no ground wires for implementing impedance control are provided on the flexible board, it will be difficult to estimate parasitic components on the wires on the differential transmission paths which are required for impedance control, and as a result, the characteristic impedance cannot be made to coincide with the predetermined value. Namely, the prior art presents a problem that ease of incorporating the flexible board on which the ground wiring for implementing impedance control into the electronic apparatus and ease of impedance control cannot be achieved at the same time.

SUMMARY OF THE INVENTION

The present invention provides an electronic apparatus which is capable of achieving ease of incorporating a flexible board, on which ground wires for implementing impedance control are provided, into the electronic apparatus and ease of impedance control at the same time.

Accordingly, the present invention provides an electronic apparatus comprising a structure configured to be equipped with a bent portion and a flat portion, and a first flexible board and a second flexible board configured to be placed along the structure, wherein differential signal wires are wired on one surface of the first flexible board, and first ground wires for implementing impedance control for the differential signal wires are wired on the other surface of the first flexible board and at locations on a rear side of the differential signal wires, second ground wires for implementing impedance control for the differential signal wires are wired on one surface of the second flexible board, the first flexible board is placed between the structure and the second flexible board, the one surface of the first flexible board is placed in such a manner as to face one surface of the second flexible board, and a wiring density of the first ground wires and the second ground wires differs between an area along the bent portion of the structure and an area along the flat portion of the structure.

According to the present invention, ease of incorporating a flexible board, on which ground wires for implementing impedance control are provided, into the electronic apparatus and ease of impedance control can be achieved at the same time.

Further features of the present invention will become apparent from the following description of exemplary embodiments (with reference to the attached drawings).

DESCRIPTION OF THE EMBODIMENTS

An embodiment of the present invention will now be described in detail with reference to the drawings. It should be noted that in the following description of the present embodiment, the present invention is applied to a digital camera which is an electronic apparatus equipped with flexible boards, but the present invention is not limited to the digital camera. For example, the present invention may be applied to apparatuses equipped with flexible boards, such as a smartphone, a tablet terminal, a PC, and a multifunction peripheral.

Figure 1A:
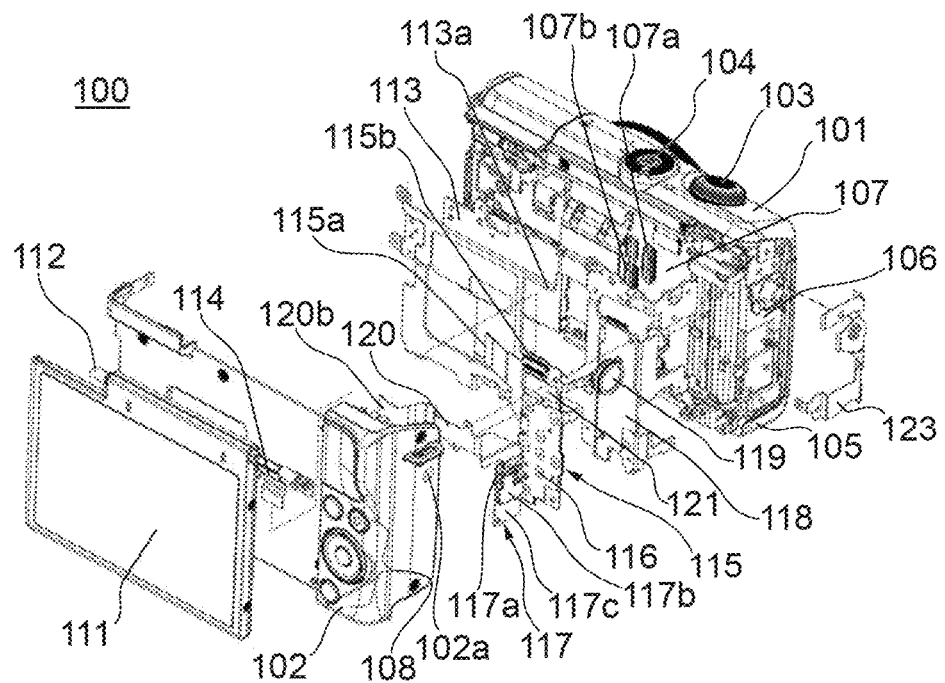
FIGS. 1A and 1B are exploded perspective views schematically showing an arrangement of a digital camera which is an electronic apparatus according to an embodiment of the present invention.
Figure 1B:
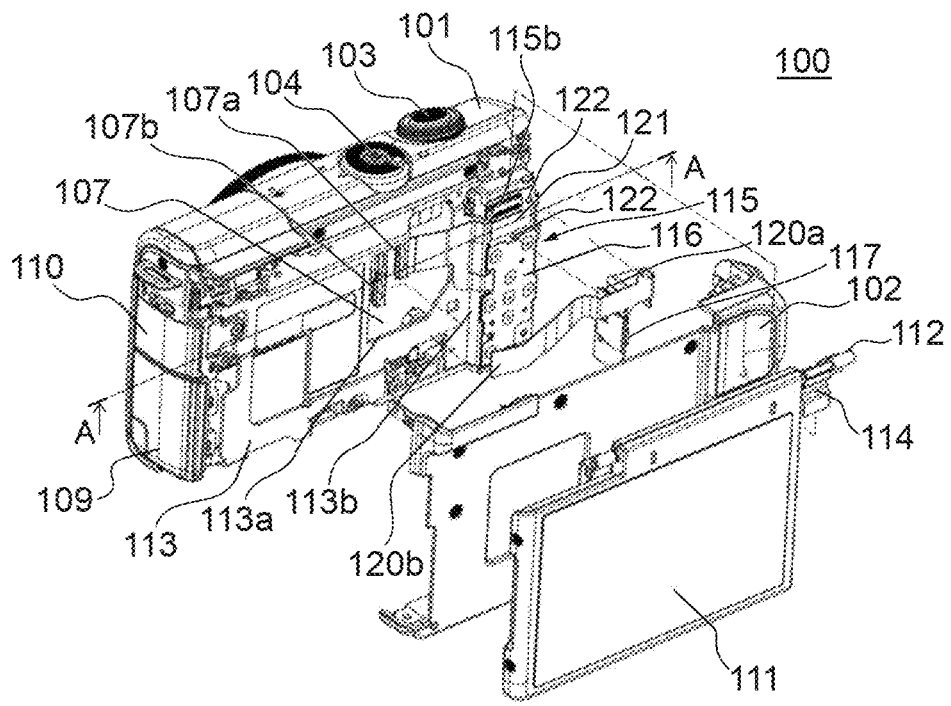

FIGS. 1A and 1B are exploded perspective views schematically showing an arrangement of the digital camera 100 which is the electronic apparatus according to the embodiment of the present invention. FIG. 1A is an exploded perspective view showing a rear side of the digital camera 100 as seen from the upper right. FIG. 1B is an exploded perspective view showing the rear side of the digital camera 100 as seen from the upper left. It should be noted that in the present embodiment, only components needed to describe the present invention are shown in the drawings, and the other components are not shown in the drawings so that the drawings used to describe the present invention can be simplified.

Referring to FIG. 1A, the digital camera 100 has a front cover 101, a main chassis 113 (a structure), an operating flexible board 115 (a first flexible board), a wireless communication board 117, a rear cover 102, and a display unit 111. They are arranged in this order when the digital camera 100 is viewed from the front. A release button 103 and a power button 104 are provided on a top face of the front cover 101. The front cover 101 forms an exterior of a bottom side of the digital camera 100. A battery lid 105 for inserting and removing a battery (not shown) is provided on the bottom side of the digital camera 100. The battery is housed in a battery box (not shown) formed inside the front cover 101. The battery box is formed in a front base 106 located inside the front cover 101. The front base 106 is formed of, for example, a magnesium die casting or resin and holds a lens mount (not shown) and a main board 107, which will be described later. A memory card lid 109 and an interface lid 110 are provided on a left side of the front cover 101 such that they can be opened and closed. It should be noted that in the following description, a right side and a left side of a main body of the digital camera 100 and its components will be referred to as the right side and the left side, respectively.

The rear cover 102 forms a rear side of the digital camera 100 and also forms an exterior of the right side of the digital camera 100. An operating button group 108 is provided on the rear cover 102. Membrane switches 116 placed on the operating flexible board 115 are configured to be depressed when the operating button group 108 is depressed. A speaker 119, which is soldered to the operating flexible board 115, is bonded to and fixed on the front base 106.

The display unit 111 is comprised of an LCD (Liquid Crystal Display), an organic EL display (Electro-Luminescence) display, or the like. The display unit 111 displays shot images, a screen for setting shooting conditions, and so forth. It should be noted that the display unit 111 may be a display with a touch panel function. The display unit 111 is fixed to the main chassis 113 by screws so as to be able to tilt via a tilt hinge 112. A display signal for displaying an image on the display unit 111 is sent from a display unit flexible board 114. The display unit flexible board 114 is a one-sided display flexible board, which has a wiring area on only one side thereof, and is thin and flexible. The display unit flexible board 114 is wrapped around a tilt hinge shaft. The display unit flexible board 114 is wound on and unwound from the tilt hinge shaft in response to rotation of the tilt hinge 112 so that its connection can be maintained.

The main board 107 is a multilayer board. Electronic components are mounted on both sides of the main board 107. The main board 107 is interposed between the front base 106 and the main chassis 113, which is metallic, and fixed with screws. A video engine that, for example, performs various types of control for the digital camera 100 and processes shot image data is mounted on one side of the main board 107 which faces the front base 106.

The operating flexible board 115 is a double-sided flexible board, which has wiring areas on both sides thereof, and is thin and flexible. The operating flexible board 115 is fixed to the main chassis 113 by a double-faced tape 118. The operating flexible board 115 has a connector terminal unit 115a and a connector 115b. A connector 107a mounted on the main board 107 is connected to the connector terminal unit 115a. The display unit flexible board 114 is connected to the connector 115b. On the operating flexible board 115, wires are connected from the connector 115b to the connector terminal unit 115a so as to implement communication with the main board 107.

The wireless communication board 117 is located on the right side of the digital camera 100 and fixed to the main chassis 113 by screws. The wireless communication board 117 is comprised of an antenna unit 117c and a circuit unit 117b. A shield case (not shown) is attached to the circuit unit 117b. The antenna unit 117c is a wireless communication antenna. The wireless communication antenna is susceptible to peripheral metallic components such as a metallic exterior, chassis, and circuit board. To obtain a sufficient communication distance and communication speed on wireless communications, the wireless communication antenna needs to be placed some distance away from the metallic components. Accordingly, the antenna unit 117c is placed a predetermined distance away from the metallic components so as not to be affected by the metallic components. The wireless communication board 117 also needs to be connected to a ground which serves as a reference potential. In the present embodiment, the wireless communication board 117 is fixed to the main chassis 113, which is a main ground in the digital camera 100, by screws. By fixing the wireless communication board 117 to the main chassis 113, heat generated from the circuit unit 117b can be released to the main chassis 113.

A connector 117a is mounted on the wireless communication board 117. The wireless communication board 117 is electrically connected to the main board 107 via a relay flexible board 120 (a second flexible board). The relay flexible board 120 is a double-sided flexible board, which has wiring areas on both sides thereof, and is thin and flexible. The relay flexible board 120 has a connector terminal unit 120a at one end and has a connector terminal unit 120b at the other end. The connector terminal unit 120a is connected to the connector 117a on the wireless communication board 117. The connector terminal unit 120b is connected to the connector 107b on the main board 107. The relay flexible board 120 is attached to and fixed on the operating flexible board 115 by a double-faced tape 121 (a fixing member) having a predetermined thickness. The relay flexible board 120 and the operating flexible board 115 are attached together by inserting positioning pins 122 into positioning holes 120m in FIG. 4A, which will be described later, provided in the relay flexible board 120 so as to prevent the relay flexible board 120 and the operating flexible board 115 from going out of alignment. A shield metal sheet 123 is placed so as to cover the shield case of the circuit unit 117b of the wireless communication board 117. Because of this layout, even when, for example, static electricity is applied to the wireless communication board 117 through a gap between the front cover 101 and the rear cover 102, the shield metal sheet 123 plays a role as a lightening rod to protect the wireless communication board 117 from the static electricity. The shield metal sheet 123 is also placed so as to cover the speaker 119. Because of this layout, even when, for example, static electricity is applied to a sound hole 102a for the speaker 119, which is provided in the rear cover 102, the shield metal sheet 123 plays a role as a lightening rod to protect the speaker 119 from the static electricity.

Figure 2:
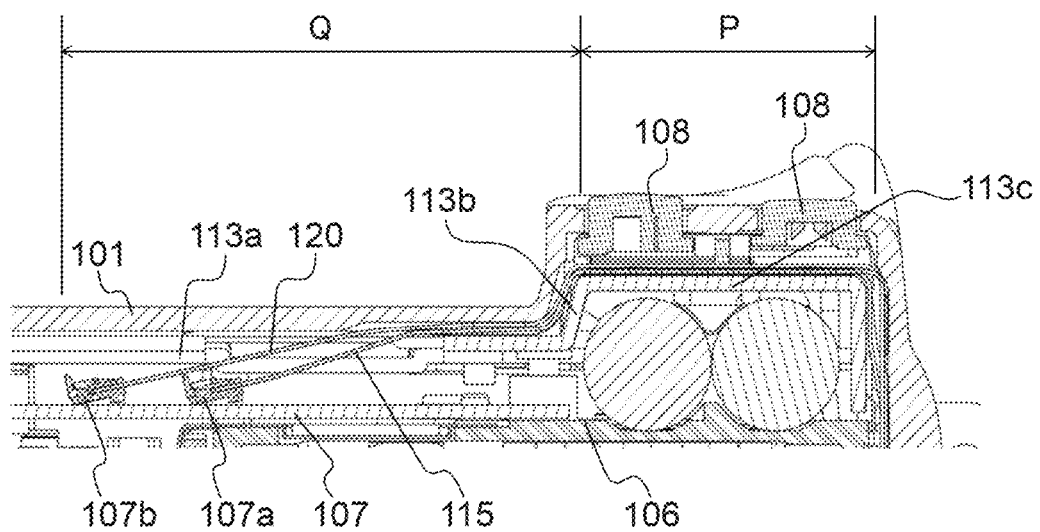
FIG. 2 is a cross-sectional view taken along line A-A in FIG. 1B.

FIG. 2 is a cross-sectional view taken along line A-A in FIG. 1B. It should be noted that in FIG. 2, only component elements needed for description are illustrated, and the display unit 111 is not illustrated.

The operating flexible board 115 and the relay flexible board 120 are placed to overlap each other when viewed from the rear of the digital camera 100. Through a hole portion 113a provided in the main chassis 113, the operating flexible board 115 is connected to the connector 107a on the main board 107, and the relay flexible board 120 is connected to the connector 107b on the main board 107. The operating flexible board 115 and the relay flexible board 120 are placed along a bent portion 113b and a flat portion 113c provided in the main chassis 113. The operating flexible board 115 is attached to the flat portion 113c by a double-faced tape 118. In the following description, in the operating flexible board 115 and the relay flexible board 120, an area that overlaps the flat portion 113c when viewed from the rear of the digital camera 100 is referred to as a flat area P, and an area that includes an area overlapping the bent portion 113b and excludes the flat area P is referred to as a bent area Q. In the present embodiment, the operating flexible board 115 and the relay flexible board 120 are not fixed in the bent area Q and are fixed in the flat area P by the double-faced tape 118 or the like. Fixing only a part of them in this manner minimizes areas to be fixed and simplifies assembly work such as connection of connectors.

Figure 3A:
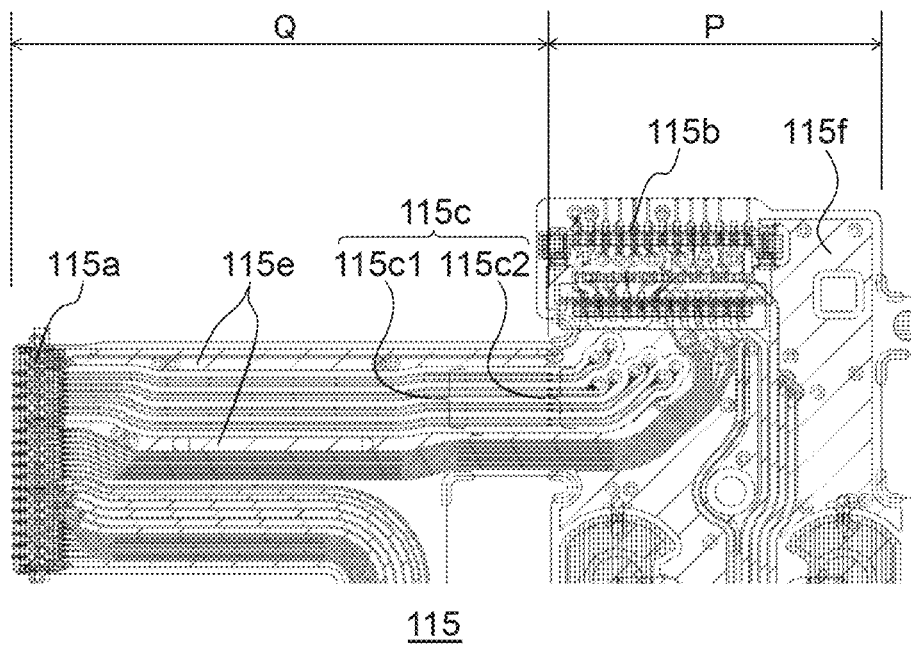
FIGS. 3A and 3B are views schematically showing a construction of an operating flexible board in FIGS. 1A and 1B.
Figure 3B:
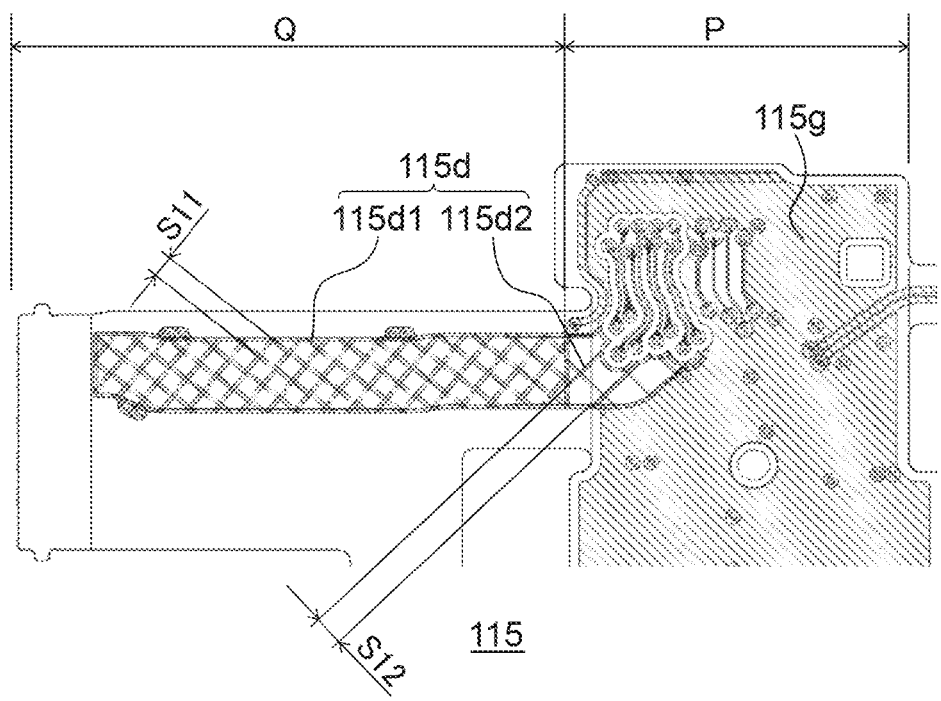

FIGS. 3A and 3B are views schematically showing a construction of the operating flexible board 115 appearing in FIGS. 1A and 1B. FIG. 3A shows a construction of a front surface of the operating flexible board 115. The front surface of the operating flexible board 115 is a surface that faces the relay flexible board 120. FIG. 3B shows a construction of a rear surface of the operating flexible board 115. The rear surface of the operating flexible board 115 is a surface that faces the main chassis 113.

Referring to FIG. 3A, on the front surface of the operating flexible board 115, a differential signal wire group 115c including a plurality of differential signal wires is wired from the connector terminal unit 115a to the connector 115b. The differential signal wires are each comprised of two signal wires transmitting signals of opposite phases. On the operating flexible board 115, a differential signal is detected based on a difference between signals transmitted on the two signal wires. The differential signal is a display signal transmitted from the display unit 111. A characteristic impedance of the differential signal wires (hereafter referred to as "the differential impedance") is designed to be a predetermined value, for example, 100Ω, which is determined according to standards. In the present embodiment, a wiring width and a wiring interval (hereafter referred to as "the wiring pattern") of the differential signal wire group 115c in the bent area Q is different from the wiring pattern in the flat area P. In the following description, in the differential signal group 115c, a wiring area corresponding to the bent area Q is referred to as a differential wiring area 115c1, and a wiring area corresponding to the flat area P is referred to as a differential wiring area 115c2. On the front surface of the operating flexible board 115, ground wires 115e are wired so as to surround the differential signal group 115c. The ground wires 115e functions as elements that protect the differential signal group 115c by preventing interference from the other signal wires, and performs impedance control, which will be described later, designed to make the differential impedance coincide with 100Ω. A signal wire for an operating system, a control signal wire for the display unit 111, a signal wire, a power wire, and a ground wire for the speaker 119 are also wired on the front surface of the operating flexible board 115. They are connected to the main board 107 via the connector terminal unit 115a. On the front surface of the operating flexible board 115, ground wires 115f is wired in a solid pattern so as to suppress interference with the relay flexible board 120.

Referring to FIG. 3B, on the rear surface of the operating flexible board 115, ground wires 115d for implementing impedance control are wired at locations on a rear side of the differential signal wire group 115c. In the ground wires 115d, a wiring area corresponding to the bent area Q, that is, a wiring area located on a rear side of the differential wiring area 115c1 is referred to as a ground wiring area 115d1. Also, in the ground wires 115d, a wiring area corresponding to the flat area P, that is, a wiring area located on a rear side of the differential wiring area 115c2 is referred to as a ground wiring area 115d2. A wiring pattern of the ground wires 115d has a plurality of openings, for example, a mesh shape with a plurality of openings formed at predetermined intervals. In the present embodiment, a wiring density of the ground wire 115d is adjusted by changing sizes and shapes of the openings to implement impedance control. In the following description, a size of the openings in the ground wiring area 115d1 is referred to as an opening size S11, and a size of the openings in the ground wiring area 115d2 is referred to as an opening size S12. The opening size S11 is different from the opening size S12. Namely, in the present embodiment, in the ground wires 115d on the operating flexible board 115, the ground wiring area 115d1 corresponding to the bent area Q and the ground wiring area 115d2 corresponding to the flat area P have different wiring densities. On the rear surface of the operating flexible board 115, ground wires 115g are also wired in a solid pattern so as to suppress interference with the main chassis 113.

Figure 4A:
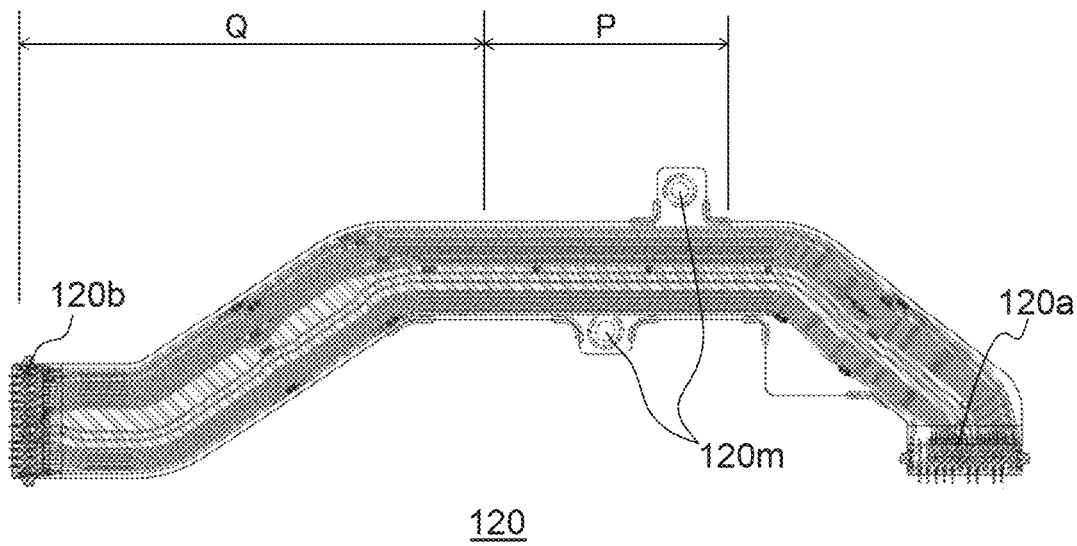
FIGS. 4A and 4B are views schematically showing a construction of a relay flexible board in FIGS. 1A and 1B.
Figure 4B:
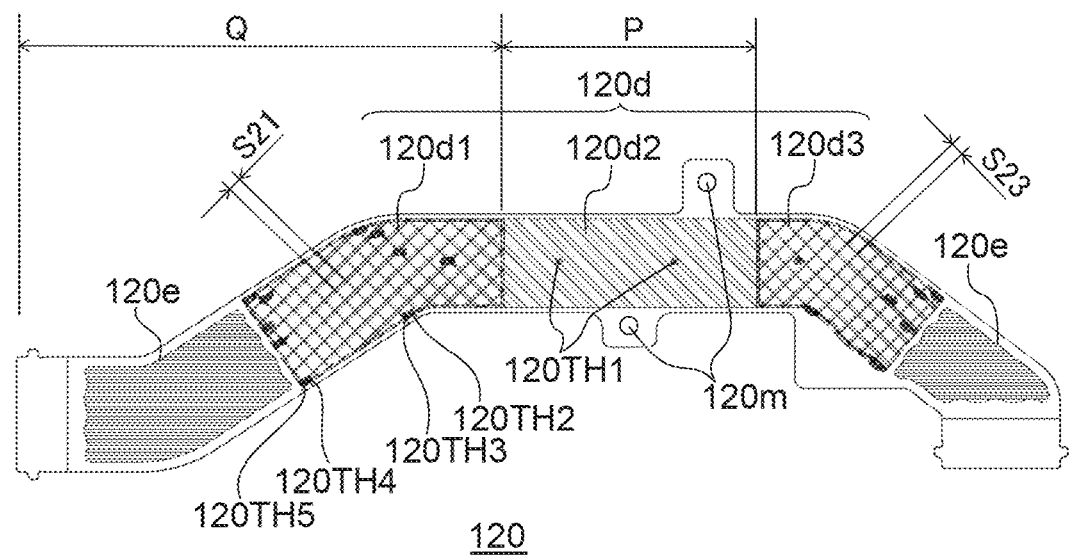

FIGS. 4A and 4B are views schematically showing a construction of the relay flexible board 120 in FIGS. 1A and 1R FIG. 4A shows a construction of a front surface of the relay flexible board 120. The front surface of the relay flexible board 120 is on a rear side of a surface that faces the operating flexible board 115. FIG. 4B shows a construction of a rear surface of the relay flexible board 120. The rear surface of the relay flexible board 120 is the surface that faces the operating flexible board 115.

Referring to FIG. 4A, a signal wire group for operating the wireless communication board 117 is wired on the front surface of the relay flexible board 120. This signal wire group includes, for example, a control signal wire, clock signal wire, data signal wire, power wire, and ground wire.

Referring to FIG. 4B, ground wires 120d are wired on the rear surface of the relay flexible board 120. In the present embodiment, a wiring pattern of the ground wire 120d in the bent area Q differs from that in the flat area P. In the following description, in the ground wires 120d, a wiring area corresponding to the bent area Q, that is, a wiring area facing the differential wiring area 115c1 is referred to as a ground wiring area 120d1. Also, in the ground wires 120d, a wiring area corresponding to the flat area P, that is, a wiring area facing the differential wiring area 115c2 is referred to as a ground wiring area 120d2. The other area in the ground wires 120d is referred to as a ground wiring area 120d3. A wiring pattern in the ground wiring area 120d2 is a solid pattern. A wiring pattern in the ground wiring areas 120d1 and 120d3 is a mesh pattern in which a plurality of openings is provided at predetermined intervals. Namely, in the present embodiment, in the ground wires 120d on the relay flexible board 120, the ground wiring area 120d1 corresponding to the bent area Q and the ground wiring area 120d2 corresponding to the flat area P have different wiring densities. In the following description, a size of the openings in the ground wiring area 120d1 is referred to as an opening size S21, and a size of the openings in the ground wiring area 120d3 is referred to as an opening size S23.

On the rear surface of the relay flexible board 120, coverlay openings 120e are formed in areas where the ground wire 120d is not wired. The coverlay openings 120e are areas where no coverlays for protecting the relay flexible board 120 are formed. Since no coverlays are formed in the areas where the ground wire 120d is not wired, the relay flexible board 120 is softened. Particularly because no coverlays are formed near the connector terminal units 120a and 120b as shown in FIG. 4B, portions near the connector terminal units 120a and 120b can be softened, and hence insertion of connectors can be made easier.

Figure 5:
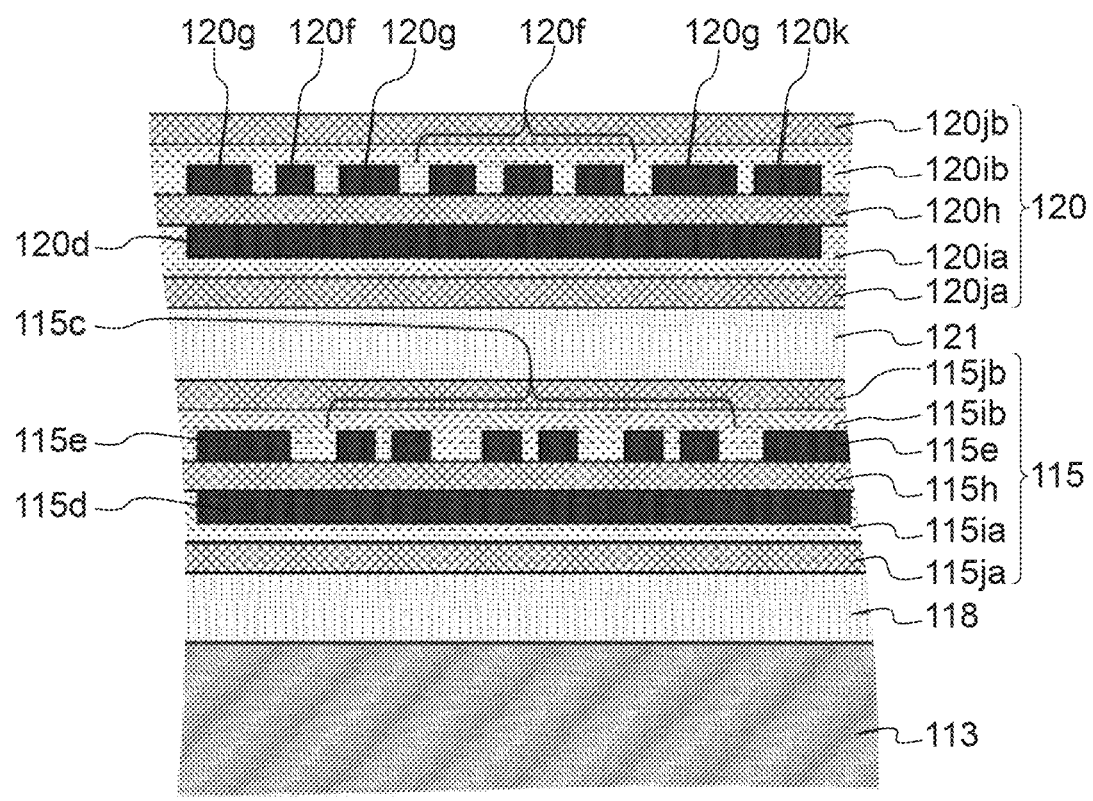
FIG. 5 is a cross-sectional view showing a plane exposed by cutting flat areas P of the operating flexible board and the relay flexible board in a direction in which they are arranged.

FIG. 5 is a cross-sectional view showing a plane exposed by cutting the flat areas P of the operating flexible board 115 and the relay flexible board 120 in a direction in which they are arranged.

Referring to FIG. 5, a coverlay 115ja for protecting the rear surface of the operating flexible board 115 is attached to the main chassis 113 by the double-faced tape 118. The coverlay 115ja is joined to the ground wires 115d wired on the rear surface of the operating flexible board 115, and a base material 115h of the operating flexible board 115 by an adhesive agent 115ia. A coverlay 115j b for protecting the front surface of the operating flexible board 115 is attached to a coverlay 120ja, which is for protecting the rear surface of the relay flexible board 120, by the double-faced tape 121. The coverlay 115jb for the operating flexible board 115 is joined to the differential signal wire group 115c and the ground wires 115e, which are wired on the front surface of the operating flexible board 115, and the base material 115h of the operating flexible board 115 by an adhesive agent 115ib. The coverlay 120ja for the relay flexible board 120 is joined to the ground wires 120d, which are wired on the rear surface of the relay flexible board 120, and the base material 120h of the relay flexible board 120 by an adhesive agent 120ia. On the front surface of the relay flexible board 120, ground wires 120g are wired along a signal wire group 120f for wireless communication, and also, a ground wire 120g is wired along a power wire 120k. On the front surface of the relay flexible board 120, a coverlay 120jb is joined to the signal wire group 120f for wireless communication, the ground wires 120g, the power wire 120k, and the base material 120h of the relay flexible board 120 by an adhesive agent 120ib.

In the present embodiment, impedance control is implemented by adjusting the wiring density of the ground wires 115d on the operating flexible board 115 and the wiring density of the ground wires 120d on the relay flexible board 120. In the case where the rear surface of the relay flexible board 120 is located in proximity to and in opposed relation to the differential signal wire group 115c on the operating flexible board 115 as in the present embodiment, parasitic components between the differential signal wire group 115c and the ground wires 120d wired on the rear surface of the relay flexible board 120 acts on the differential impedance. The impedance of wiring usually lowers as a conductor comes closer, and rises as the conductor goes away. For this reason, in the case where the relay flexible board 120 is located in proximity to and in opposed relation to the differential signal wire group 115c on the operating flexible board 115, the differential impedance is lower than in the case where the relay flexible board 120 is not located in proximity to and in opposed relation to the differential signal wire group 115c on the operating flexible board 115. With consideration given to this, in the present embodiment, the digital camera 100 is designed such that the differential impedance is higher than 100Ω with the operating flexible board 115 alone, but when the rear surface of the relay flexible board 120 is placed in proximity to and in opposed relation to the differential signal wire group 115c on the operating flexible board 115, the differential impedance is controlled to be equal to 100Ω by impedance control. It should be noted that in the present embodiment, by attaching the relay flexible board 120 to the operating flexible board 115 by the double-faced tape 121, the distance between the operating flexible board 115 and the relay flexible board 120 is fixed at a predetermined value to reduce changes in differential impedance. Moreover, although the main chassis 113 is a conductor made of stainless steel, parasitic components between the main chassis 113 and the differential signal wire group 115c can be prevented from arising by providing the ground wires 115d between the differential signal wire group 115c and the main chassis 113. Furthermore, by attaching the operating flexible board 115 to the main chassis 113 by the double-faced tape 118, the differential signal line group 115c can be separated from the main chassis 113 by a certain distance. As a result, parasitic components between the main chassis 113 and the differential signal wire group 115c can be reliably prevented from arising.

The signal wire group 120f for wireless communication wired on the relay flexible board 120 includes a clock signal wire, a command signal wire, and a data signal wire. Signals transmitted on these signal wires are susceptible to external noise such as static electricity. For example, if static electricity is applied to an exterior's metallic portion of the digital camera 100, static electricity noise will propagate from the main chassis 113 inside the digital camera 100 to the signal wire group 120f for wireless communication, causing shutdown of communication or decrease in communication speed. To cope with this, in the present embodiment, the ground wires 120g are wired along the signal wire group 120f for wireless communication on the relay flexible board 120. Also, on the main chassis 113 side of the relay flexible board 120, that is, on the rear surface of the relay flexible board 120, the ground wires 120d are wired. The operating flexible board 115 on which the ground wires 115d are wired is interposed between the relay flexible board 120 and the main chassis 113. Thus, in the present embodiment, a plurality of ground wires for protecting the signal wire group 120f for wireless communication is provided for the path over which static electricity propagates from the main chassis 113 to the signal wire group 120f for wireless communication. This suppresses propagation of static electricity noise from the main chassis 113 to the signal wire group 120f for wireless communication on the relay flexible board 120.

According to the embodiment described above, in the ground wires 115d on the operating flexible board 115, the ground wiring area 115d1 corresponding to the bent area Q and the ground wiring area 115d2 corresponding to the flat area P have different wiring densities. Also, in the ground wires 120d on the relay flexible board 120, the ground wiring area 120d1 corresponding to the bent area Q and the ground wiring area 121d2 corresponding to the flat area P have different wiring densities. Therefore, flexibility of the bent area Q on each flexible board can be maintained by changing the wiring density of the bent area Q while ground wires for performing impedance control are remained on the operating flexible board 115 and the relay flexible board 120. As a result, ease of incorporating the operating flexible board 115 and the relay flexible board 120, on which ground wires for implementing impedance control are provided, into the digital camera 100, and ease of impedance control can be achieved at the same time.

Figure 6:
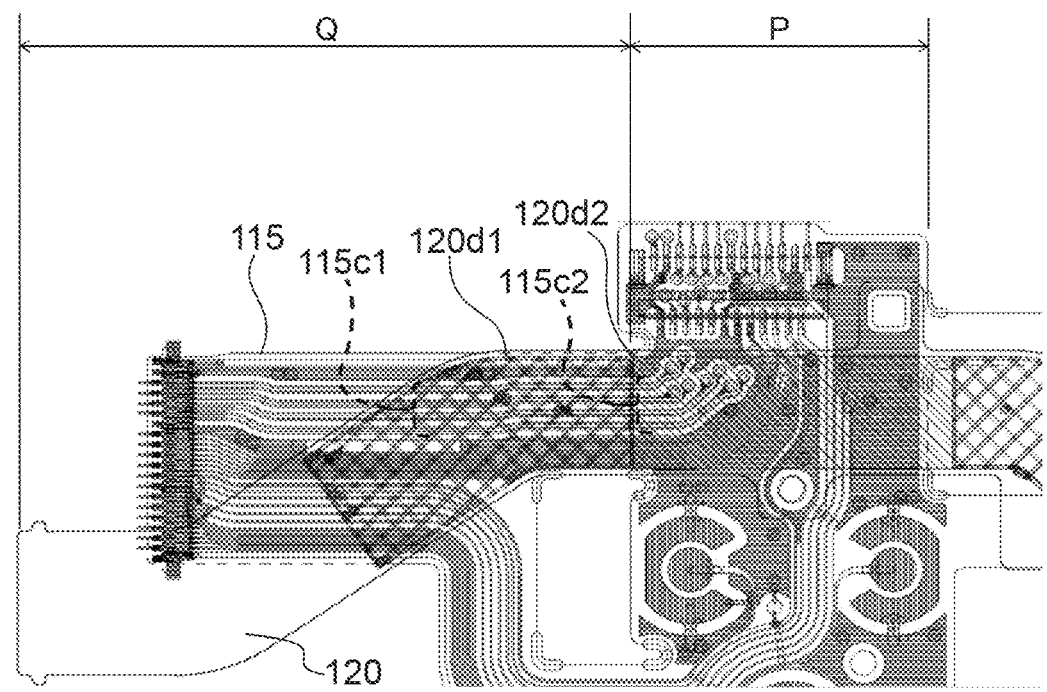
FIG. 6 is a view showing a state in which the operating flexible board and the relay flexible board overlap each other.

FIG. 6 is a view showing a state in which the operating flexible board 115 and the relay flexible board 120 overlap each other. It should be noted that in FIG. 6, the relay flexible board 120 is transparent so that an arrangement of the operating flexible board 115 can be understood.

In the flat area P, the operating flexible board 115 is attached to the main chassis 113, and the relay flexible board 120 is attached to the operating flexible board 115. Referring to FIG. 6, the differential wiring area 115c2 is formed in the flat area P of the operating flexible board 115, and the ground wiring area 120d2 of the relay flexible board 120 is formed at a location overlapping the differential wiring area 115c2. The ground wiring area 120d2 is formed in a wiring pattern, such as a solid pattern, which has a higher wiring density than the ground wiring area 120d1. By forming the ground wiring area 120d2 in the solid pattern, propagation of static electricity noise from the main chassis 113 to the signal wire group 120f for wireless communication formed on the front surface of the relay flexible board 120 can be suppressed. Also, by forming the ground wiring area 120d2 in the solid pattern, the flat area P in the relay flexible board 120 can be hardened, and this makes it easier to attach the relay flexible board 120 to the operating flexible board 115.

The differential impedance usually lowers as a wiring density of an opposed conductor increases, and rises as the wiring density decreases. For this reason, in the case where the ground wiring area 120d2 on the relay flexible board 120, which is formed in the solid pattern with an extremely high wiring density, is located in proximity to and in opposed relation to the differential wiring area 115c2 on the operating flexible board 115, the differential impedance is too low. With consideration given to this, in the present embodiment, the wiring density of the differential wiring area 115d2 on the operating flexible board 115 is decreased so that the differential impedance will not become too low due to the ground wiring area 120d2 formed in the solid pattern. Specifically, the opening size S12 in the differential wiring area 115d2 is increased to reduce the area of copper foil in the differential wiring area 115d2. It should be noted that the opening size S12 is larger than the opening size S11. Namely, in the present embodiment, the wiring density of the ground wires 115d in the ground wiring area 115d2 in the flat area P is lower than in the ground wiring area 115d1 in the bent area Q. With this arrangement, the differential impedance in the flat area P can be adjusted to be an appropriate value in accordance with the wiring density of the ground wires 120d on the relay flexible board 120 which are placed in opposed relation to and in proximity to the differential signal wire group 115c.

It should be noted that if the wiring densities of both the ground wiring area 120d2 on the relay flexible board 120 and the ground wiring area 115d2 on the operating flexible board 115 are increased, the differential impedance will become too low. To compensate for this, the differential impedance needs to be increased by reducing the wiring width of the differential signal wire group 115c. On this occasion, if the wiring width is excessively narrowed, manufacturing may become difficult, and hence it is preferred that impedance control is performed by decreasing the wiring density in the ground wiring area 115d2.

In the bent area Q, the operating flexible board 115 and the relay flexible board 120 are bent between the main chassis 113 and the rear cover 102. If the ground wires 120d on the relay flexible board 120 are wired in a solid pattern, the area of copper foil will increase, causing the relay flexible board 120 to lose its flexibility. If the relay flexible board 120 loses its flexibility, the relay flexible board 120 will push the other components in the bent area Q, making it difficult to assemble the relay flexible board 120 in accordance with the bent shape. Moreover, inserting the connector terminal unit 120d of the relay flexible board 120 into the connector 107d will become difficult. To cope with this, in the present embodiment, the ground wiring area 120d1 on the relay flexible board 120 is wired in a mesh pattern with a plurality of openings so as to maintain the flexibility of the relay flexible board 120 in the bent area Q. This makes it easier to assemble the relay flexible board 120 in accordance with the bent shape.

Moreover, in the embodiment described above, the ground wiring area 115d1 on the operating flexible board 115 is wired in a mesh pattern with a plurality of openings so as to maintain the flexibility of the operating flexible board 115 in the bent area Q. This makes it easier to assemble the operating flexible board 115 in accordance with the bent shape.

Furthermore, in the embodiment described above, the wiring densities of the ground wires 115d and 120d are adjusted by changing the shape or size of the openings. As a result, the differential impedance can be made to coincide with a predetermined value merely by adjusting the shape or size of the openings in the ground wires 115d and 120d.

In the embodiment described above, the wiring density of the ground wires 120d on the relay flexible board 120 is lower in the ground wiring area 120d1 in the bent area Q than in the ground wiring area 120d2 in the flat area P. This makes the bent area Q softer than at least the flat area P on the relay flexible board 120.

Although the present invention has been described by way of the embodiment, the present invention should not be limited to the embodiment described above. For example, impedance control may be performed not only by adjusting the shape or size of the openings in the mesh pattern but also adjusting the wiring width of differential signal wires or the wiring interval of differential signal wires. It should be noted that if the wiring width of differential signal wires is varied with areas in the case where impedance control is performed by adjusting the wiring width of differential signal wires, a trouble may occur due to, for example, reflection of signals at locations where the wiring width varies. For this reason, it is preferred that impedance control is performed by adjusting the shape or size of the openings in the mesh pattern.

Moreover, in the embodiment described above, it is preferred that the ground wiring area 120d3, which is not opposed to the differential signal wire group 115c on the operating flexible board 115, is wired in a mesh pattern as well. This makes it easier to assemble the ground wiring area 120d3 on the relay flexible board 120 in accordance with the bent shape.

In the embodiment described above, the ground wires 120g on the front surface of the relay flexible board 120 and the ground wires 120d on the rear surface of the relay flexible board 120 may be configured to be electrically continuous via through holes.

Moreover, in the embodiment described above, it is preferred that on the relay flexible board 120, more through holes are formed in the ground wiring areas 120d1 corresponding to the bent area Q than in the ground wiring areas 120d2 corresponding to the flat area P. Through holes 120TH1 are formed in the ground wiring areas 120d2. The ground wiring area 120d2 is a ground area with relatively low impedance because it is wired in the solid pattern. On the other hand, the ground wiring areas 120d1 and 120d3 are ground areas with higher impedance than the ground wiring area 120d2 because they are wired in the mesh pattern. To stabilize the potential level of the ground which is the reference potential of the relay flexible board 120, it is preferred that the impedance of the ground wiring areas 120d1 and 120d3 is lowered. Accordingly, in the present embodiment, on the relay flexible board 120, more through holes are formed in the ground wiring areas 120d1 corresponding to the bent area Q than in the ground wiring areas 120d2 corresponding to the flat area P. As a result, the impedance of the ground wiring areas 120d1 and 120d3 can be lowered, and the potential level of the ground on the relay flexible board 120 can be stabilized.

Furthermore, in the embodiment described above, it is preferred that in the ground wiring areas 120d1 and 120d3 corresponding to the bent area Q of the relay flexible board 120, at least two through holes may be formed adjacent to each other. Since the ground wiring areas 120d1 and 120d3 in the mesh pattern are bent, stress tends to be applied to an area where the through holes connect the front and rear surfaces of the relay flexible board 120 with each other, and hence the through holes may be broken. To prevent this, for example, two through holes are formed adjacent to each other as with through holes 120TH2 and 120TH3 in FIG. 4A. By forming the through holes in this manner, even if one of them is broken, the other one can maintain connection between the ground wires on the front surface and the rear surface of the relay flexible board 120.

In the embodiment described above, it is preferred that through holes are formed at ends of the ground wiring area 120d1 and 120d3 wired in the mesh pattern (see, for example, through holes 120TH4 and 120TH5). Forming the through holes in this manner can prevent noise from being generated using the ground wiring area 120d1 and 120d3 as antennas.

Although in the embodiment described above, the ground wiring area 120d2 on the relay flexible board 120 is wired in the solid pattern, the ground wiring area 120d2 may be wired in a mesh pattern whose openings are small. In this arrangement, impedance control is performed by reducing the opening size S12 in the mesh pattern of the ground wiring area 115d2 on the operating flexible board 115, which is opposed to the ground wiring area 120d2.

In the embodiment described above, it is preferred that the shape and size of the openings in the ground wires are determined so that the flexible boards in the bent area Q can be soft, and variations in the wiring width of the differential signal wire group 115c fall within a manufacturable range.

Moreover, in the embodiment described above, the shape of the openings provided in the ground wires is not limited to a square, but may be other shapes such as a circle, a rhombus, and a rectangle.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent constructions and functions.

This application claims the benefit of Japanese Patent Application No. 2019-084359, filed Apr. 25, 2019, which is hereby incorporated by reference herein in its entirety.

What is claimed is:

1. An electronic apparatus comprising:
   a structure configured to be equipped with a bent portion and a flat portion; and
   a first flexible board and a second flexible board configured to be placed along the structure,
   wherein differential signal wires are wired on one surface of the first flexible board, and first ground wires are wired on the other surface of the first flexible board and at locations on a rear side of the differential signal wires,
   second ground wires are wired on one surface of the second flexible board,
   the first flexible board is placed between the structure and the second flexible board,
   the one surface of the first flexible board is placed in such a manner as to face one surface of the second flexible board, and
   a wiring density of the first ground wires and the second ground wires differs between an area along the bent portion of the structure and an area along the flat portion of the structure.

2. The electronic apparatus according to claim 1, wherein the first ground wires and the second ground wires have a plurality of openings in the area along the bent portion of the structure.

3. The electronic apparatus according to claim 2, wherein the wiring density of the first ground wires and the second ground wires is adjusted by changing a shape or size of the openings.

4. The electronic apparatus according to claim 1, wherein the wiring density of the second ground wires is lower in the area along the bent portion of the structure than in the area along the flat portion of the structure.

5. The electronic apparatus according to claim 4, wherein in the second ground wires, the area along the flat portion of the structure are wired in a solid pattern.

6. The electronic apparatus according to claim 4, wherein the wiring density of the first ground wires is lower in the area along the flat portion of the structure than in the area along the bent portion of the structure.

7. The electronic apparatus according to claim 1, wherein the first flexible board is bonded to the second flexible board by a fixing member having a predetermined thickness.

8. The electronic apparatus according to claim 1, wherein third ground wires are wired on the other surface of the second flexible board,
in the second flexible board, the second ground wires and the third ground wires are made electrically continuous by through holes,
in the second flexible board, more through holes are formed in the area along the bent portion of the structure than in the area along the flat portion of the structure.

9. The electronic apparatus according to claim 8, wherein in the second flexible board, at least two of the through holes are formed adjacent to each other in the area along the bent portion of the structure.

10. The electronic apparatus according to claim 1, wherein the first ground wires are implementing impedance control for the differential signal wires, and the second ground wires are implementing impedance control for the differential signal wires.

* * * * *